United States Patent
Ikeda

(10) Patent No.: US 10,958,156 B2
(45) Date of Patent: Mar. 23, 2021

(54) ELECTRONIC CIRCUIT, POWER CONVERSION DEVICE, DRIVING DEVICE, VEHICLE, AND ELEVATOR

(71) Applicant: Kabushiki Kaisha Toshiba, Minato-ku (JP)

(72) Inventor: Kentaro Ikeda, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 250 days.

(21) Appl. No.: 16/111,457

(22) Filed: Aug. 24, 2018

(65) Prior Publication Data

US 2019/0296635 A1    Sep. 26, 2019

(30) Foreign Application Priority Data

Mar. 21, 2018 (JP) .............................. JP2018-053637

(51) Int. Cl.
*H02M 1/32*       (2007.01)
*H02M 7/5387*  (2007.01)
(Continued)

(52) U.S. Cl.
CPC .............. *H02M 1/32* (2013.01); *B66B 11/043* (2013.01); *G01R 19/16576* (2013.01);
(Continued)

(58) Field of Classification Search
CPC ........ H02M 1/32; H02M 7/5387; H02M 1/08; H02M 2001/0054; H02M 1/44;
(Continued)

(56) References Cited

U.S. PATENT DOCUMENTS 7,750,595 B2   7/2010   Yamada et al.
7,804,353 B2   9/2010   Tai
(Continued)

FOREIGN PATENT DOCUMENTS

JP           5-328746          12/1993
JP        2007-221863          8/2007
(Continued)

OTHER PUBLICATIONS

Yanick Lobsiger, et al., "Closed-Loop IGBT Gate Drive Featuring Highly Dynamic di/dt and dv/dt Control," IEEE, 2012, pp. 4754-4761.
(Continued)

*Primary Examiner* — Dharti H Patel
(74) *Attorney, Agent, or Firm* — Oblon, McClelland, Maier & Neustadt, L.L.P.

(57) ABSTRACT

Provided is a semiconductor device including: a semiconductor element including a first electrode, a second electrode, and a gate electrode; a surge voltage measuring unit electrically connected to the first electrode or the second electrode and configured to measure a surge voltage; a variable resistor electrically connected to the gate electrode; a comparator configured to compare a surge voltage measurement value, which is acquired by measuring the surge voltage generated by a first pulse applied to the gate electrode by the surge voltage measuring unit, with a surge voltage target value; a determination unit configured to determine a setting value of a resistance value of the variable resistor based on the comparison result by the comparator; and an instruction unit configured to instruct the setting value to the variable resistor.

14 Claims, 13 Drawing Sheets

(51) Int. Cl.

| | |
|---|---|
| *H02P 27/06* | (2006.01) |
| *H02H 9/04* | (2006.01) |
| *G01R 19/165* | (2006.01) |
| *G01R 27/26* | (2006.01) |
| *B66B 11/04* | (2006.01) |
| *H02H 1/00* | (2006.01) |
| *B60C 3/00* | (2006.01) |
| *B60R 16/023* | (2006.01) |
| *B61C 3/00* | (2006.01) |

(52) U.S. Cl.
CPC ....... *G01R 27/2611* (2013.01); *H02H 1/0007* (2013.01); *H02H 9/04* (2013.01); *H02M 7/5387* (2013.01); *H02P 27/06* (2013.01); *B60R 16/023* (2013.01); *B61C 3/00* (2013.01)

(58) Field of Classification Search
CPC ...... H02M 7/53875; H02P 27/06; H02H 9/04; H02H 1/0007; H02H 7/008; G01R 19/16576; G01R 27/2611; B66B 11/043; B61C 3/00; B60R 16/023
USPC ........................................................ 361/91.1
See application file for complete search history.

(56) References Cited

U.S. PATENT DOCUMENTS

| | | | |
|---|---|---|---|
| 2005/0146295 A1* | 7/2005 | Miyamoto | ......... H03K 17/0406 |
| | | | 318/105 |
| 2018/0375423 A1 | 12/2018 | Ikeda | |
| 2019/0140536 A1 | 5/2019 | Ikeda | |
| 2019/0296634 A1 | 9/2019 | Ikeda | |

FOREIGN PATENT DOCUMENTS

| | | |
|---|---|---|
| JP | 2007-336637 | 12/2007 |
| JP | 2008-078816 | 4/2008 |
| JP | 2008-220034 | 9/2008 |
| JP | 2011-172446 A | 9/2011 |
| JP | 2016-052197 A | 4/2016 |
| JP | 2016-73127 | 5/2016 |
| JP | 2017/221004 A | 12/2017 |
| JP | 2019-9914 A | 1/2019 |
| JP | 2019-88095 A | 6/2019 |
| JP | 2019-170035 A | 10/2019 |

OTHER PUBLICATIONS

U.S. Appl. No. 16/111,446, filed Aug. 24, 2018, Kentaro Ikeda.

\* cited by examiner

US 10,958,156 B2

ELECTRONIC CIRCUIT, POWER CONVERSION DEVICE, DRIVING DEVICE, VEHICLE, AND ELEVATOR

CROSS-REFERENCE TO RELATED APPLICATION

This application is based upon and claims the benefit of priority from Japanese Patent Application No. 2018-053637, filed on Mar. 21, 2018, the entire contents of which are incorporated herein by reference.

FIELD

Embodiments described herein relate generally to a semiconductor device, a power conversion device, a driving device, a vehicle, an elevator, and a method for controlling a semiconductor device.

BACKGROUND

A surge voltage may be generated due to an inductance of a circuit, for example, when a power transistor performing a switching operation at high speed is turned off. If the surge voltage is generated, there is a problem in that breakdown of a gate insulating film may occur or ringing of the circuit may occur.

By increasing a resistance of a gate connected to a gate electrode of the power transistor, the switching speed is decreased at the time of the switching of the power transistor. It is possible to suppress the surge voltage by decreasing the switching speed. However, the decrease in the switching speed is not preferable because a switching loss is increased.

DETAILED DESCRIPTION

Figure 1:
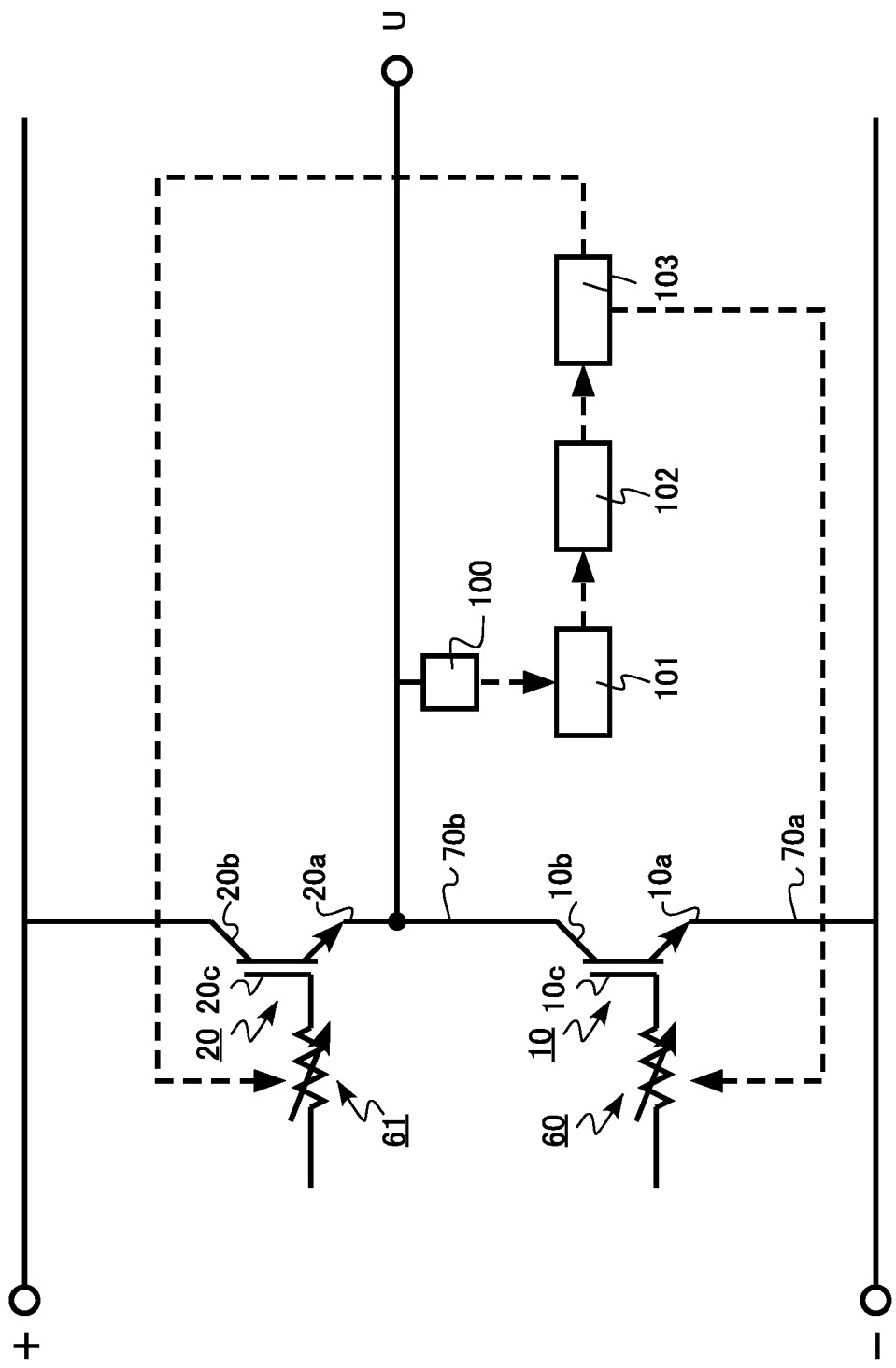
FIG. 1 is a schematic diagram of a semiconductor device according to a first embodiment.

A semiconductor device according to an embodiment includes: a semiconductor element including a first electrode, a second electrode, and a gate electrode; a surge voltage measuring unit electrically connected to any one of the first electrode and the second electrode and configured to measure a surge voltage; a variable resistor electrically connected to the gate electrode; a comparator configured to compare a surge voltage measurement value with a surge voltage target value, the surge voltage measurement value is acquired by the surge voltage measuring unit by measuring the surge voltage generated by a first pulse applied to the gate electrode; a determination unit configured to determine a setting value of a resistance value of the variable resistor based on a comparison result by the comparator; and an instruction unit configured to instruct the setting value to the variable resistor.

Hereinafter, embodiments of the present disclosure will be described with reference to the drawings. In the following description, the same or similar members or the like are denoted by the same reference numerals, and a description of members and the like which have been described is omitted as appropriate.

In addition, in this specification, the semiconductor device is a concept in which it includes an integrated circuit (IC) in which a plurality of elements are integrated into one chip, an electronic circuit board on which a plurality of electronic components are disposed, or a power module in which a plurality of elements such as a discrete semiconductor are combined.

In the present specification, a "voltage" means a potential difference with ground potential unless otherwise defined.

First Embodiment

A semiconductor device according to a first embodiment includes: a semiconductor element including a first electrode, a second electrode, and a gate electrode; a surge voltage measuring unit electrically connected to any one of the first electrode and the second electrode and configured to measure a surge voltage; a variable resistor configured to be electrically connected to the gate electrode; a comparator configured to compare a surge voltage measurement value, which is acquired by measuring the surge voltage generated by a first pulse applied to the gate electrode by the surge voltage measuring unit, with a surge voltage target value; a determination unit configured to determine a setting value of a resistance value of the variable resistor based on the comparison result by the comparator; and an instruction unit configured to instruct the setting value to the variable resistor.

A power conversion device of the first embodiment includes the semiconductor device. The semiconductor element of the first embodiment is a transistor.

Figure 2:
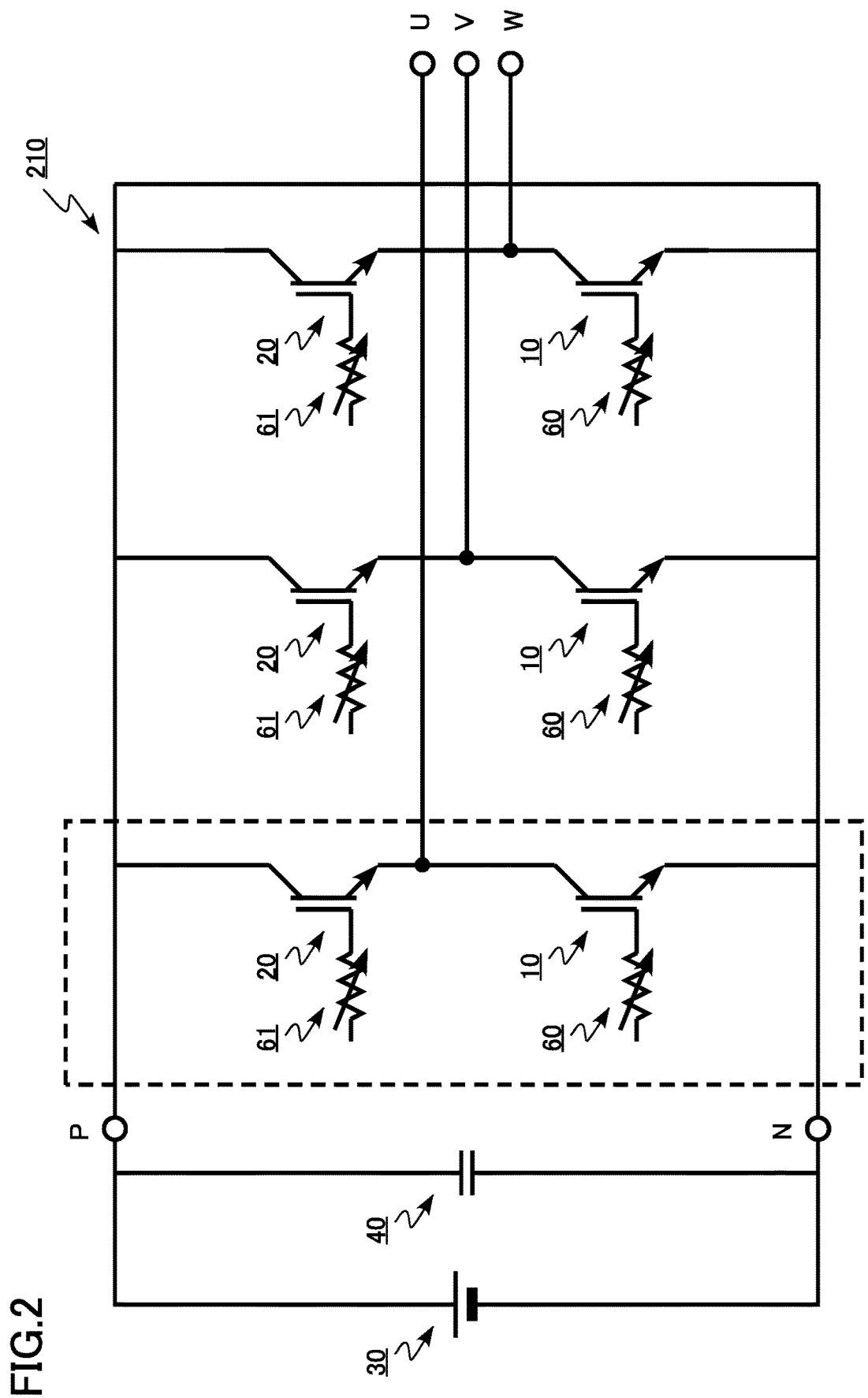
FIG. 2 is a circuit diagram of a power conversion device according to the first embodiment.

FIG. 1 is a schematic diagram of the semiconductor device of the first embodiment. FIG. 2 is a circuit diagram of the power conversion device of the first embodiment. The power conversion device of the first embodiment is an inverter circuit 210. FIG. 1 is a schematic diagram showing details of a part of the inverter circuit 210 of FIG. 2.

The inverter circuit 210 of the first embodiment realizes a so-called active gate control dynamically controlling an operation of a gate of a power transistor.

The inverter circuit 210 shown in FIG. 2 includes three pairs of low side transistors 10 (semiconductor elements) and a high side transistor 20. The inverter circuit shown in FIG. 2 includes a positive terminal P, a negative terminal N, an output terminal U, an output terminal V, an output terminal W, a first variable resistor 60, and a second variable resistor 61.

The positive terminal P is connected to a positive electrode of a direct current (DC) power supply 30, and the negative terminal N is connected to a negative electrode of the DC power supply 30. For example, a smoothing capacitor 40 is provided in parallel with the DC power supply 30 between the positive terminal P and the negative terminal N. The inverter circuit is a three-phase inverter.

The voltage of the DC power supply 30 is, for example, 200 V or more and 1500 V or less.

FIG. 1 is a schematic diagram showing details of a region including one set of the low side transistor 10 (semiconductor element) and the high side transistor 20 in the inverter circuit of FIG. 2. FIG. 1 is a schematic diagram of a region surrounded by a dotted line in FIG. 2.

The semiconductor device of the first embodiment includes the low side transistor 10 (semiconductor element), the high side transistor 20, a surge voltage measuring unit 100, a comparator 101, a determination unit 102, an instruction unit 103, a first variable resistor 60, a second variable resistor 61, a wiring 70a, and a wiring 70b.

The low side transistor 10 and the high side transistor 20 are connected in series. The low side transistor 10 has an emitter electrode 10a (first electrode), a collector electrode 10b (second electrode), and a gate electrode 10c (gate electrode). The high side transistor 20 has an emitter electrode 20a, a collector electrode 20b, and a gate electrode 20c.

The low side transistor 10 and the high side transistor 20 are, for example, an insulated gate bipolar transistor (IGBT). A free wheeling diode (not shown) is connected to the low side transistor 10 and the high side transistor 20.

The first variable resistor 60 is connected to the gate electrode 10c of the low side transistor 10. The second variable resistor 61 is electrically connected to the gate electrode 20c of the high side transistor 20.

The gate resistance of the low side transistor 10 can be changed by the first variable resistor 60. It is possible to change the resistance value of the electric resistance connected to the gate electrode 10c by the first variable resistor 60. A charging and discharging current of the gate of the low side transistor 10 can be changed by the first variable resistor 60.

The gate resistance of the high side transistor 20 can be changed by the second variable resistor 61. It is possible to change the resistance value of the electric resistance connected to the gate electrode 20c by the second variable resistor 61. A charging and discharging current of the gate of the high side transistor 20 can be changed by the second variable resistor 61.

The configurations of the first variable resistor 60 and the second variable resistor 61 are not limited as long as the resistance is variable. For example, the first variable resistor 60 and the second variable resistor 61 are MOSFETs operating in an analog manner. In addition, for example, the first variable resistor 60 and the second variable resistor 61 area plurality of MOSFETs that are connected in parallel. The resistance value is changed by switching the number of MOSFETs that are in an ON state and an OFF state.

The surge voltage measuring unit 100 is electrically connected to the collector electrode 10b. The surge voltage measuring unit 100 has a function of measuring the surge voltage generated between the low side transistor 10 and the high side transistor 20. The surge voltage measuring unit 100 directly measures the surge voltage generated at the collector electrode 10b.

The surge voltage measuring unit 100 is, for example, an electronic circuit. The surge voltage measuring unit 100 is, for example, an IC in which a plurality of elements are integrated into one chip or an electronic circuit board on which a plurality of electronic components are disposed. The configuration of the surge voltage measuring unit 100 is not limited as long as the surge voltage measuring unit 100 can measure the surge voltage. For example, it is also possible to apply an oscilloscope to the surge voltage measuring unit 100.

The comparator 101 has a function of comparing the surge voltage measurement value, which is acquired by measuring the surge voltage generated by the first pulse applied to the gate electrode 10c, by the surge voltage measuring unit 100 with the surge voltage target value. The first pulse is a pulse of the gate signal.

For example, from the viewpoint of suppressing the problem caused by the surge voltage, an upper limit value of the surge voltage target value is determined. In addition, from the viewpoint of not decreasing a switching speed, a lower limit value is determined. The surge voltage target value is a predetermined value as a specification of the semiconductor device.

The determination unit 102 has a function of determining setting values of the resistance values of the first variable resistor 60 and the second variable resistor 61 based on the comparison result by the comparator 101. Based on an error between the surge voltage measurement value and the surge voltage target value, a setting value to be applied after the second pulse subsequent to the first pulse is determined.

The setting value is determined so that the surge voltage approaches the surge voltage target value. An algorithm used for the determination is not particularly limited. For example, a proportional control, a proportional integral (PI) control, or a proportional integral differential (PID) control is applied.

The instruction unit 103 has a function of instructing the determined setting value to the first variable resistor 60 and the second variable resistor 61. For example, the instruction unit 103 instructs the setting value to the first variable resistor 60 and the second variable resistor 61 before the second pulse subsequent to the first pulse is applied to the gate electrode.

The comparator 101, the determination unit 102, and the instruction unit 103 are, for example, electronic circuits. The comparator 101, the determination unit 102, and the instruction unit 103 are, for example, logic circuits or analog circuits. The comparator 101, the determination unit 102, and the instruction unit 103 each are, for example, individual integrated circuits (ICs). The comparator 101, the determination unit 102, and the instruction unit 103 are included, for example, in one microcomputer.

Next, a method for controlling a semiconductor device according to the first embodiment will be described. The method for controlling a semiconductor device of the first embodiment includes: acquiring a surge voltage measurement value by measuring a surge voltage generated in any one of the first electrode and the second electrode by a first pulse applied to a gate electrode of a semiconductor element having a first electrode, a second electrode, and a gate electrode; comparing the surge voltage measurement value with a surge voltage target value; determining a setting value of a resistance value of a variable resistor electrically connected to the gate electrode based on the comparison result of the surge voltage measurement value with the surge voltage target value; and changing the resistance value to the setting value.

Figure 3:
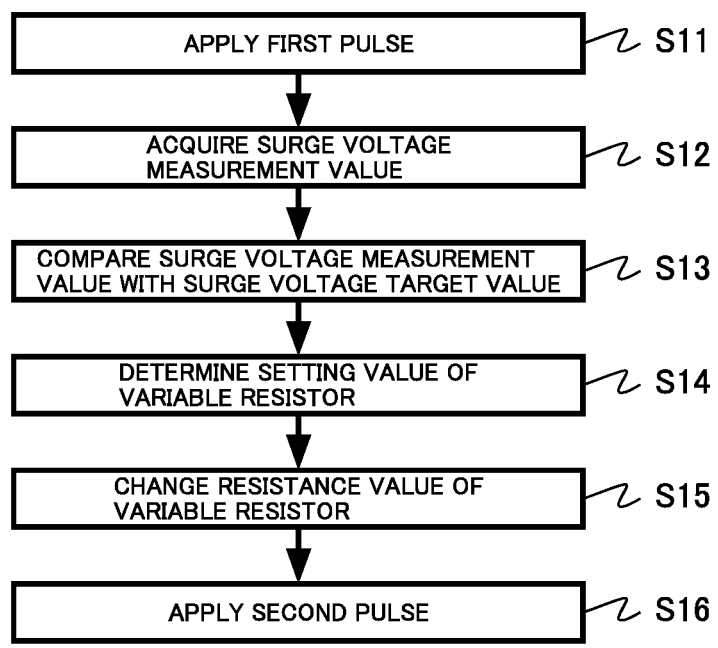
FIG. 3 is a diagram showing control steps of a method for controlling a semiconductor device according to the first embodiment.

FIG. 3 is a diagram showing control steps of the method for controlling a semiconductor device according to the first embodiment. The method for controlling a semiconductor device of the first embodiment includes applying a first pulse (S11), acquiring a surge voltage measurement value (S12), comparing the surge voltage measurement value with a surge voltage target value (S13), determining of a setting value of a variable resistor (S14), changing a resistance value of the variable resistor (S15), and applying a second pulse (S16).

For simplicity of explanation, the control of the first variable resistor 60 will be described below by way of example.

First, in the applying of the first pulse (S11), the first pulse is applied to the gate electrode 10c of the low side transistor 10. The low side transistor 10 performs an ON operation, and is then shifted to an OFF operation. The surge voltage is generated in the collector electrode 10b during the OFF operation.

Next, in the acquiring of the surge voltage measurement value (S12), the surge voltage generated in the collector electrode 10b by the application of the first pulse is measured by the surge voltage measuring unit 100. The surge voltage generated by turning off the low side transistor 10 after the application of the first pulse is measured by the surge voltage measuring unit 100.

Next, in the comparing of the surge voltage measurement value with the surge voltage target value (S13), the surge voltage measurement value is compared with the surge voltage target value. The comparison between the surge voltage measurement value and the surge voltage target value is performed by the comparator 101.

The comparator 101 determines a magnitude relation between the surge voltage measurement value and the surge voltage target value. For example, the comparator 101 calculates an error Verr between the surge voltage measurement value and the surge voltage target value.

Next, in the determining of the setting value of the variable resistor (S14), the setting value of the resistance value of the first variable resistor 60 electrically connected to the gate electrode 10c is determined based on the comparison result of the surge voltage measurement value with the surge voltage target value. The determination of the setting value is performed by the determination unit 102.

The setting value is determined, for example, based on the error between the surge voltage measurement value and the surge voltage target value so that the surge voltage approaches the surge voltage target value.

For example, when the surge voltage measured by the surge voltage measuring unit 100 exceeds the target value, the setting value is determined to increase the resistance value of the first variable resistor 60. By increasing the resistance value of the first variable resistor 60, the gate resistance of the low side transistor 10 is increased, the switching speed is decreased, and the generation of the surge voltage is suppressed. In other words, the charging/discharging current of the gate of the low side transistor 10 is decreased, and the generation of the surge voltage is suppressed.

Next, in the changing of the resistance value of the variable resistor (S15), the resistance value of the first variable resistor 60 is changed to the determined setting value. The setting value is changed according to an instruction transmitted from the instruction unit 103 to the first variable resistor 60.

Next, in the applying of the second pulse (S16), the second pulse is applied to the gate electrode 10c of the low side transistor 10. The low side transistor 10 performs an ON operation, and is then shifted to an OFF operation.

Next, functions and effects of the semiconductor device and the method for controlling the semiconductor device of the first embodiment will be described.

The surge voltage may be generated due to an inductance of a circuit, for example, when a power transistor performing a switching operation at high speed is turned off. If the surge voltage is generated, there is a problem in that breakdown of a gate insulating film may occur or ringing of the circuit may occur.

By increasing the resistance of the gate connected to the gate electrode of the power transistor, the switching speed is decreased at the time of the switching to be able to suppress the surge voltage. However, the decrease in the switching speed is not preferable because of increasing the switching loss of the power transistor.

By increasing the resistance of the gate connected to the gate electrode of the power transistor, the switching speed is decreased at the time of the switching to be able to suppress the electromagnetic noise. However, the decrease in the switching speed is not preferable because the switching loss of the power transistor is increased.

The surge voltage depends on various parameters such as the circuit configurations and operation conditions of the semiconductor device or the power conversion device and the configurations or operation conditions of loads connected to the semiconductor device or the power conversion device. For this reason, a large number of processes are required to determine an appropriate gate resistance value at the design stage of the semiconductor device or the power conversion device. In addition, even if a large number of processes are used, it is extremely difficult to determine an optimum gate resistance value.

Therefore, the gate resistance value is inevitably set to have a large margin. Therefore, the switching speed of the power transistor is unnecessarily decreased, and the switching loss of the power transistor may be increased.

The inverter circuit 210 of the first embodiment includes the surge voltage measuring unit 100. The surge voltage measuring unit 100 directly measures the surge voltage generated between the low side transistor 10 and the high side transistor 20 during the operation of the inverter circuit 210.

Based on the measurement result measured by the surge voltage measuring unit 100, the inverter circuit 210 controls the first variable resistor 60. The inverter circuit 210 changes the resistance value of the first variable resistor 60 so that the resistance value of the first variable resistor 60 is an appropriate resistance value during the operation of the inverter circuit. A so-called active gate control is executed.

Figure 4A:
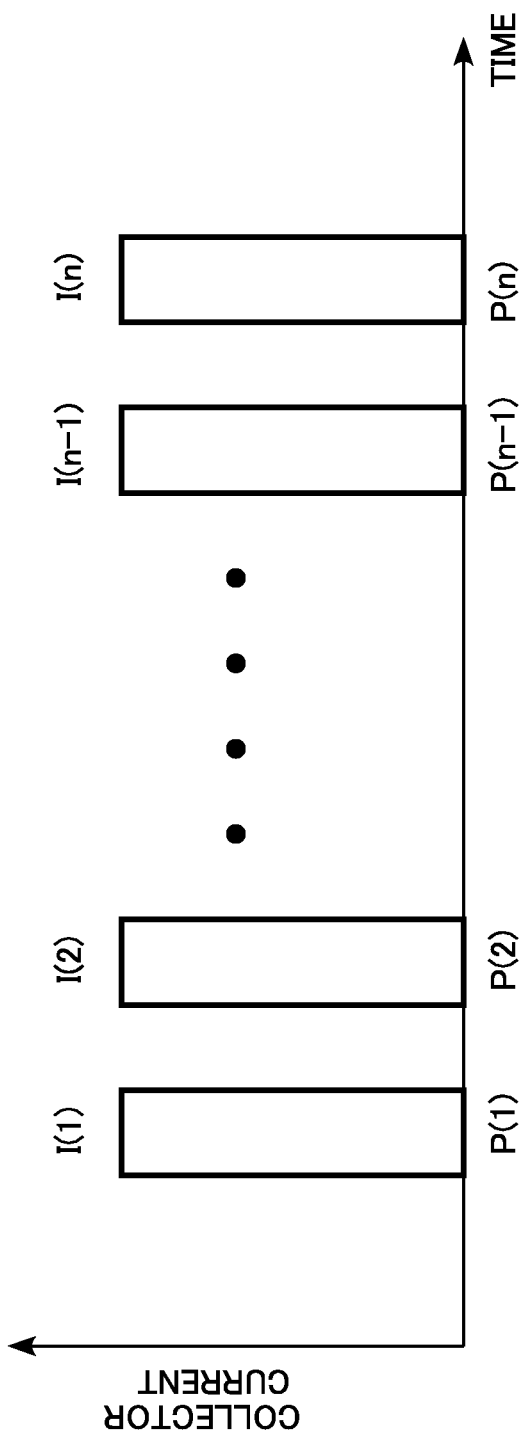
FIGS. 4A and 4B are explanatory diagrams of functions of the semiconductor device and the method for controlling a semiconductor device according to the first embodiment.
Figure 4B:
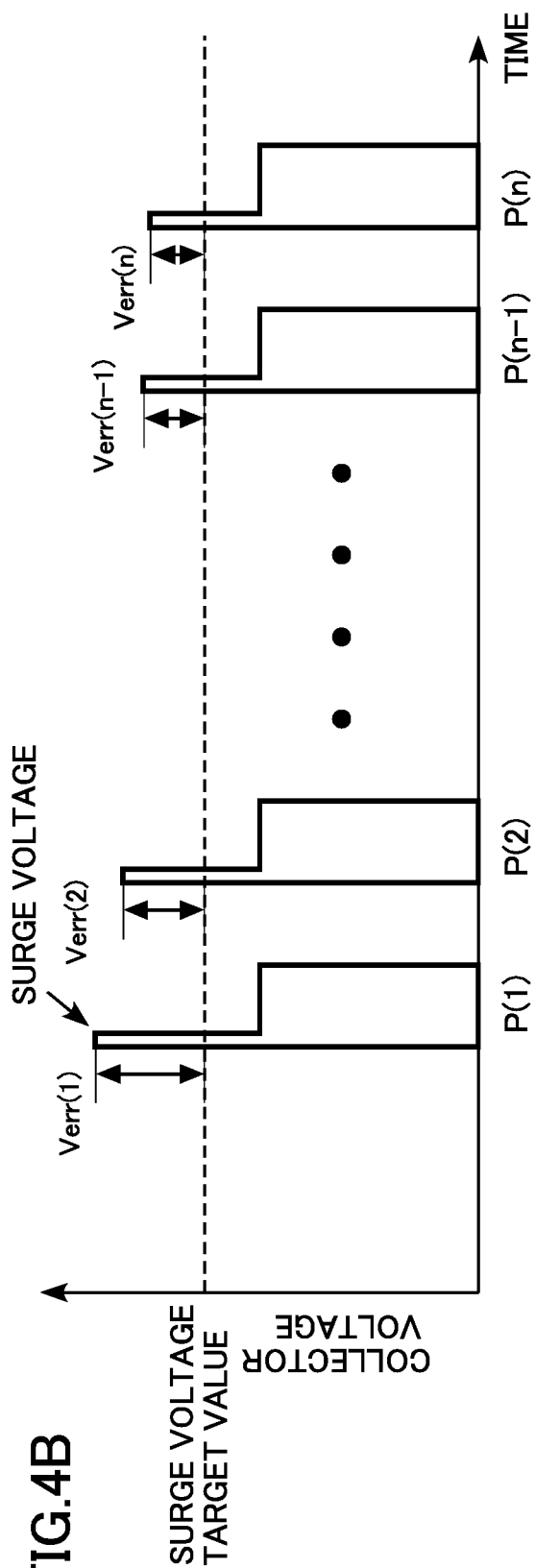

FIGS. 4A and 4B are explanatory diagrams of functions of the semiconductor device and the method for controlling a semiconductor device according to the first embodiment. FIGS. 4A and 4B show a collector current and a collector voltage corresponding to each pulse of the gate signal applied to the low side transistor 10. FIG. 4A shows the collector current corresponding to each pulse of the gate signal, and FIG. 4B shows the collector voltage corresponding to each pulse of the gate signal.

In FIGS. 4A and 4B, the first pulse applied to the gate electrode 10c is represented by P(1), the second pulse is represented by P(2), a (n−1)-th pulse is represented by P(n−1), and an n-th pulse is represented by P(n). Here, n is an integer of 3 or more.

In response to each pulse, the low side transistor 10 repeats the ON operation and the OFF operation. As shown in FIG. 4A, the collector current flows during the ON operation and the collector current is cut off during the OFF operation. In FIG. 4A it is assumed that the collector current is constant for each pulse.

As shown in FIG. 4B, when the low side transistor 10 is shifted from the ON operation to the OFF operation, the collector voltage overshoots and the surge voltage is generated. For example, an error Verr(1) exists between the surge voltage generated by the first pulse P1 and the surge voltage target value.

In the first embodiment, before the second pulse P(2) is applied to the gate electrode 10c, the resistance value of the first variable resistor 60 is changed to the determined setting value. The resistance value of the first variable resistor 60 is changed to be larger than the resistance value of the first variable resistor 60 when the first pulse P1 is applied.

Therefore, the surge voltage when the second pulse P(2) is applied is suppressed, and an error Verr(2) becomes smaller than the Verr(1). The same control is repeated ever after the second pulse P(2).

For example, a method for feeding back measurement results of the collector current and the collector voltage generated by the first pulse to a first pulse in real time is also conceivable. However, in this method, an extremely fast gate resistance control is required. For example, it is required to execute feedback in several nanoseconds to several tens of nanoseconds, and it is difficult to control the gate resistance.

In the case of the first embodiment, the measurement result of the surge voltage generated by the first pulse is fed back after the second pulse. Therefore, for example, it is sufficient to execute feedback in several microseconds to several tens of microseconds. Therefore, it is easy to control the gate resistance. Further, the comparator 101, the determination unit 102, and the instruction unit 103 which are necessary for the control can be realized with a simple configuration.

In the case of the first embodiment, for example, the measurement result of the surge voltage of the first pulse may be fed back after the third pulse from the viewpoint of giving a margin for feedback time.

According to the first embodiment, the measurement result of the surge voltage measuring unit 100 is fed back to the resistance value of the first variable resistor 60. With this feedback, the generation of the surge voltage can be suppressed.

Furthermore, the control to bring the surge voltage close to the surge voltage target value is always performed. Therefore, the resistance value of the first variable resistor 60 can be set to a necessary and sufficient resistance value for suppressing the surge voltage. Therefore, the switching speed of the low side transistor 10 is not unnecessarily decreased, and the increase in the switching loss can be suppressed.

Further, according to the first embodiment, the surge voltage measuring unit 100 is provided and the measurement result can be fed back to the resistance value of the first variable resistor 60, such that precise alignment at the design stage of the semiconductor device or the power conversion device becomes unnecessary. Therefore, the number of circuit design processes can be decreased.

As described above, according to the first embodiment, the increase in the switching loss can be suppressed, and the low-loss semiconductor device and power conversion device, and the method for controlling the semiconductor device can be realized. Further, the measurement result of the surge voltage can be fed back to the gate resistance with a simple configuration. In addition, the number of processes of the circuit design of the semiconductor device and the power conversion device can be decreased.

Second Embodiment

A semiconductor device according to a second embodiment is different from that of the first embodiment in that the semiconductor device further includes: a current measuring unit configured to measure a current of a wiring electrically connected to a first electrode or a second electrode; a calculator configured to calculate an inductance using a surge voltage reference value acquired by the surge voltage measuring unit and a current reference value acquired by the current measuring unit; and a surge voltage prediction unit configured to calculate a surge voltage prediction value from the inductance and a current prediction value of the semiconductor element, wherein the determination unit determines the setting value based on the surge voltage prediction value. Hereinafter, a part of the description duplicated with the first embodiment will not be described.

Figure 5:
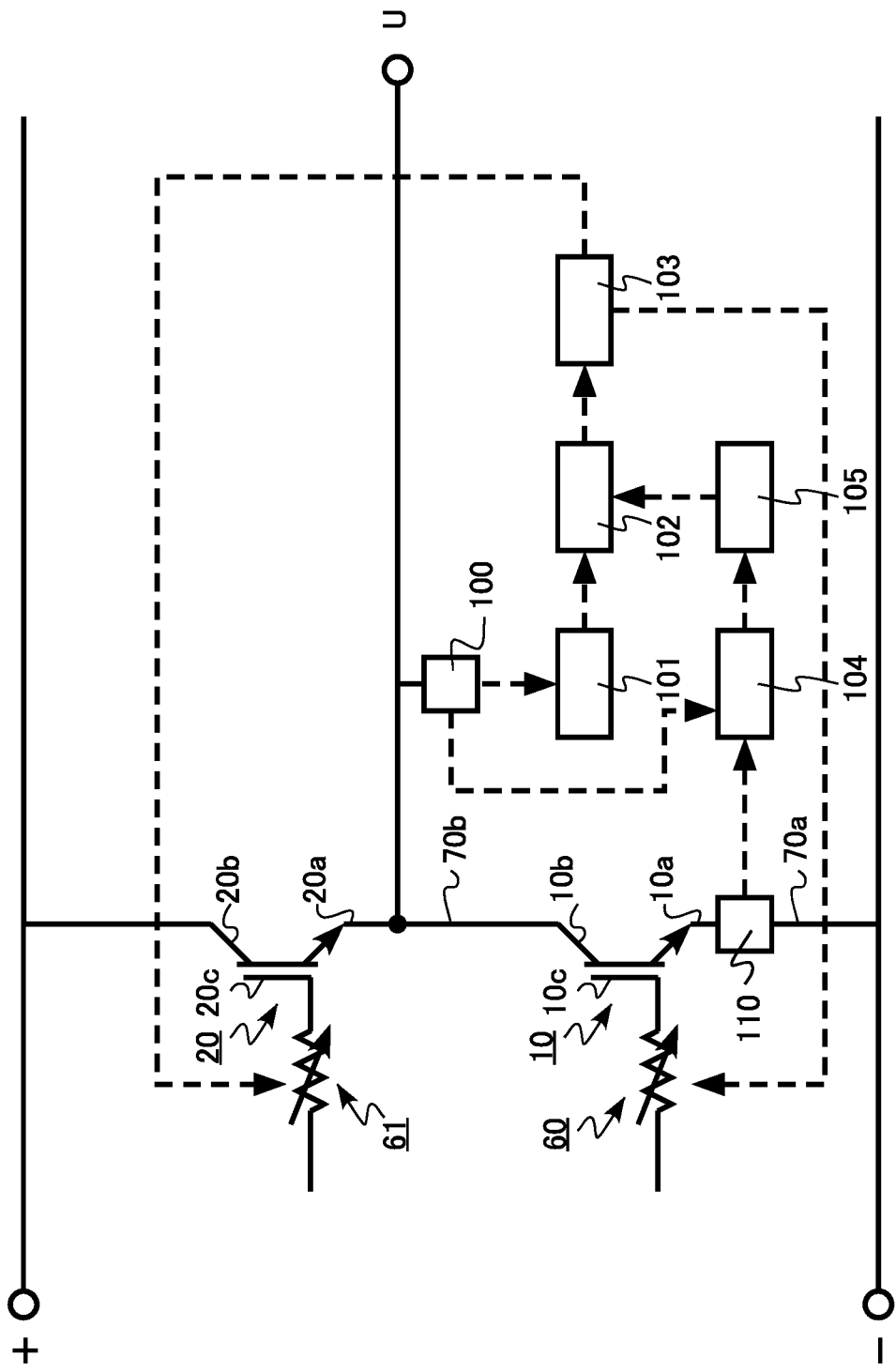
FIG. 5 is a schematic diagram of a semiconductor device according to a second embodiment.

FIG. 5 is a schematic diagram of the semiconductor device of the second embodiment. The power conversion device of the second embodiment is an inverter circuit using the semiconductor device of FIG. 5.

The semiconductor device of the second embodiment includes a low side transistor 10 (semiconductor element), a high side transistor 20, a surge voltage measuring unit 100, a comparator 101, a determination unit 102, an instruction unit 103, a calculator 104, a surge voltage prediction unit 105, a current measuring unit 110, a first variable resistor 60, a second variable resistor 61, a wiring 70a, and a wiring 70b.

The current measuring unit 110 has a function of measuring a current flowing in the wiring 70a electrically connected to an emitter electrode 10a. The current measuring unit 110 is, for example, an ampere meter. The configuration of the current measuring unit 110 is not limited as long as the current measuring unit 110 can measure a current generated in the wiring 70a.

The calculator 104 has a function of calculating an inductance of the circuit by using a surge voltage reference value acquired by the surge voltage measuring unit 100 and a current reference value acquired by the current measuring unit 110.

The surge voltage is a product of the inductance and the change in current. The inductance of the circuit can be calculated from the surge voltage measured by the surge voltage measuring unit 100 and a change (di/dt) in current measured by the current measuring unit 110. The current reference value is, for example, the change in current or a current value. Assuming that the change in current occurs in a fixed time, even when the current reference value is taken as the current value, it is possible to calculate the inductance of the circuit, strictly, the value proportional to the inductance.

The surge voltage prediction unit 105 has a function of calculating the surge voltage prediction value from the inductance of the circuit and the current prediction value of the transistor. If the magnitude of the inductance of the circuit is already known, it is possible to predict the surge voltage to be generated from the current prediction value of the transistor.

Like the first embodiment, the determination unit 102 has a function of determining setting values of the resistance values of the first variable resistor 60 and the second variable resistor 61 based on the comparison result by the comparator 101. Based on an error between the surge voltage measurement value and the surge voltage target value, a setting value to be applied after the second pulse subsequent to the first pulse is determined.

Further, the determination unit 102 has a function of determining the setting value based on the surge voltage prediction value calculated by the surge voltage prediction unit 105. For example, when determining the setting value, the determination unit 102 has a function of correcting the setting value based on the surge voltage prediction value calculated by the surge voltage prediction unit 105.

The calculator 104 and the surge voltage prediction unit 105 are, for example, electronic circuits. The calculator 104 and the surge voltage prediction unit 105 are, for example, logic circuits or analog circuits. The calculator 104 and the surge voltage prediction unit 105 each are, for example, individual ICs. The calculator 104 and the surge voltage prediction unit 105 are included, for example, in one microcomputer like the comparator 101, the determination unit 102, and the instruction unit 103.

Next, a method for controlling a semiconductor device according to the second embodiment will be described. The method for controlling a semiconductor device of the second embodiment is different from that of the first embodiment in that the method includes acquiring a surge voltage reference value by measuring a surge voltage, acquiring a current measurement value by measuring a current flowing through a wiring electrically connected to a first electrode or a second electrode, calculating an inductance using a surge voltage reference value and a current measurement value, calculating a surge voltage prediction value from the inductance and a current prediction value of the semiconductor element, and determining a setting value based on the surge voltage prediction value. Hereinafter, a part of the description duplicated with the first embodiment will not be described.

Figure 6:
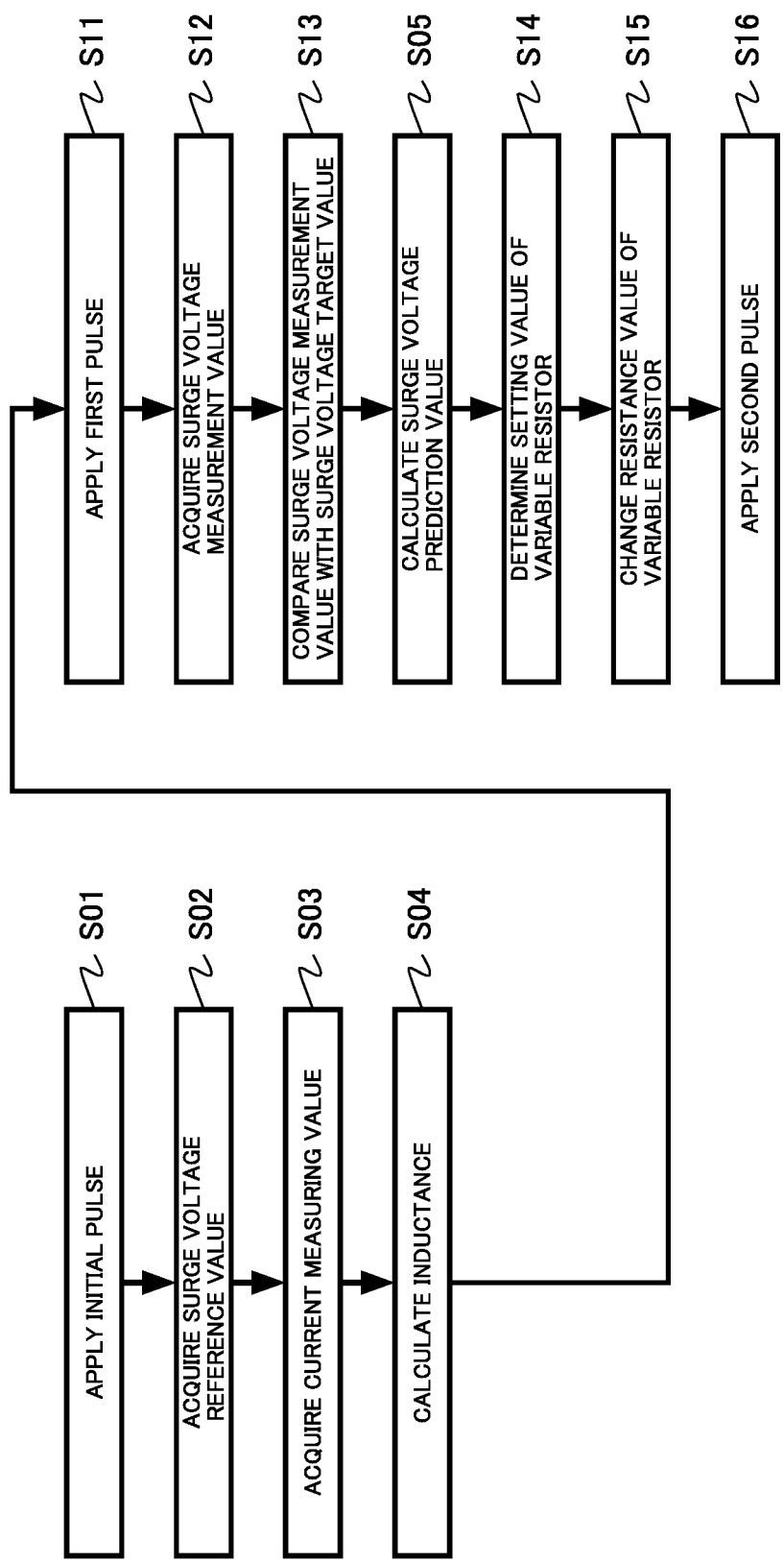
FIG. 6 is a diagram showing control steps of a method for controlling a semiconductor device according to the second embodiment.

FIG. 6 is a diagram showing control steps of the method for controlling a semiconductor device according to the second embodiment. The method for controlling a semiconductor device of the second embodiment includes applying an initial pulse (S01), acquiring a surge voltage reference value (S02), acquiring a current measurement value (S03), calculating an inductance (S04), applying a first pulse (S11), acquiring a surge voltage measurement value (S12), comparing the surge voltage measurement value with a surge voltage target value (S13), calculating a surge voltage prediction value (S05), determining a setting value of a variable resistor (S14), changing a resistance value of the variable resistor (S15), and applying a second pulse (S16).

For simplicity of explanation, the control of the first variable resistor 60 will be described below by way of example.

First, in the applying of the initial pulse (S01), the initial pulse is applied to the gate electrode 10*c* of the low side transistor 10. The low side transistor 10 performs an ON operation, and is then shifted to an OFF operation. The surge voltage is generated in the collector electrode 10*b* during the OFF operation.

Next, in the acquiring of the surge voltage reference value (S02), the surge voltage generated in the collector electrode 10*b* by the application of the initial pulse is measured by the surge voltage measuring unit 100. The surge voltage generated by turning off the low side transistor 10 after the application of the initial pulse is measured by the surge voltage measuring unit 100. The surge voltage reference value is acquired by the measurement by the surge voltage measuring unit 100.

Next, in the acquiring of the current measurement value (S03), the current flowing through the wiring 70*a* electrically connected to the emitter electrode 10*a* is measured by the current measuring unit 110. The current measurement value is acquired by the measurement by the current measuring unit 110.

Next, in the calculating of the inductance (S04), the inductance of the circuit is calculated using the surge voltage reference value and the current measurement value. The calculation of the inductance is performed by the calculator 104.

Next, in the applying of the first pulse (S11), the first pulse is applied to the gate electrode 10*c* of the low side transistor 10.

Next, in the acquiring of the surge voltage measurement value (S12), the surge voltage generated in the collector electrode 10*b* by the application of the first pulse is measured by the surge voltage measuring unit 100.

Next, in the comparing of the surge voltage measurement value with the surge voltage target value (S13), the surge voltage measurement value is compared with the surge voltage target value. The comparison between the surge voltage measurement value and the surge voltage target value is performed by the comparator 101.

The comparator 101 determines a magnitude relation between the surge voltage measurement value and the surge voltage target value. For example, the comparator 101 calculates an error Verr between the surge voltage measurement value and the surge voltage target value.

Next, in the calculating of the surge voltage prediction value (S05), the surge voltage prediction value is calculated from the inductance and the current prediction value of the transistor. The calculation of the surge voltage prediction value is performed by the surge voltage prediction unit 105. For example, the surge voltage prediction unit 105 acquires the current prediction value of the transistor associated with the second pulse applied to the gate electrode 10*c* from a gate signal controller (not shown).

Next, in the determining of the setting value of the variable resistor (S14), the setting value of the resistance value of the first variable resistor 60 electrically connected to the gate electrode 10*c* is determined based on the comparison result of the surge voltage measurement value with the surge voltage target value and the surge voltage prediction value. The setting value acquired from the comparison result of the surge voltage measurement value with the surge voltage target value is corrected based on the surge voltage prediction value, and the setting value is determined. The determination of the setting value is performed by the determination unit 102.

Next, in the changing of the resistance value of the variable resistor (S15), the resistance value of the first variable resistor 60 is changed to the determined setting value.

Next, in the applying of the second pulse (S16), the second pulse is applied to the gate electrode 10c of the low side transistor 10. The low side transistor 10 performs an ON operation, and is then shifted to an OFF operation.

Next, functions and effects of the semiconductor device and the method for controlling a semiconductor device of the second embodiment will be described.

Figures 7A, 7B:
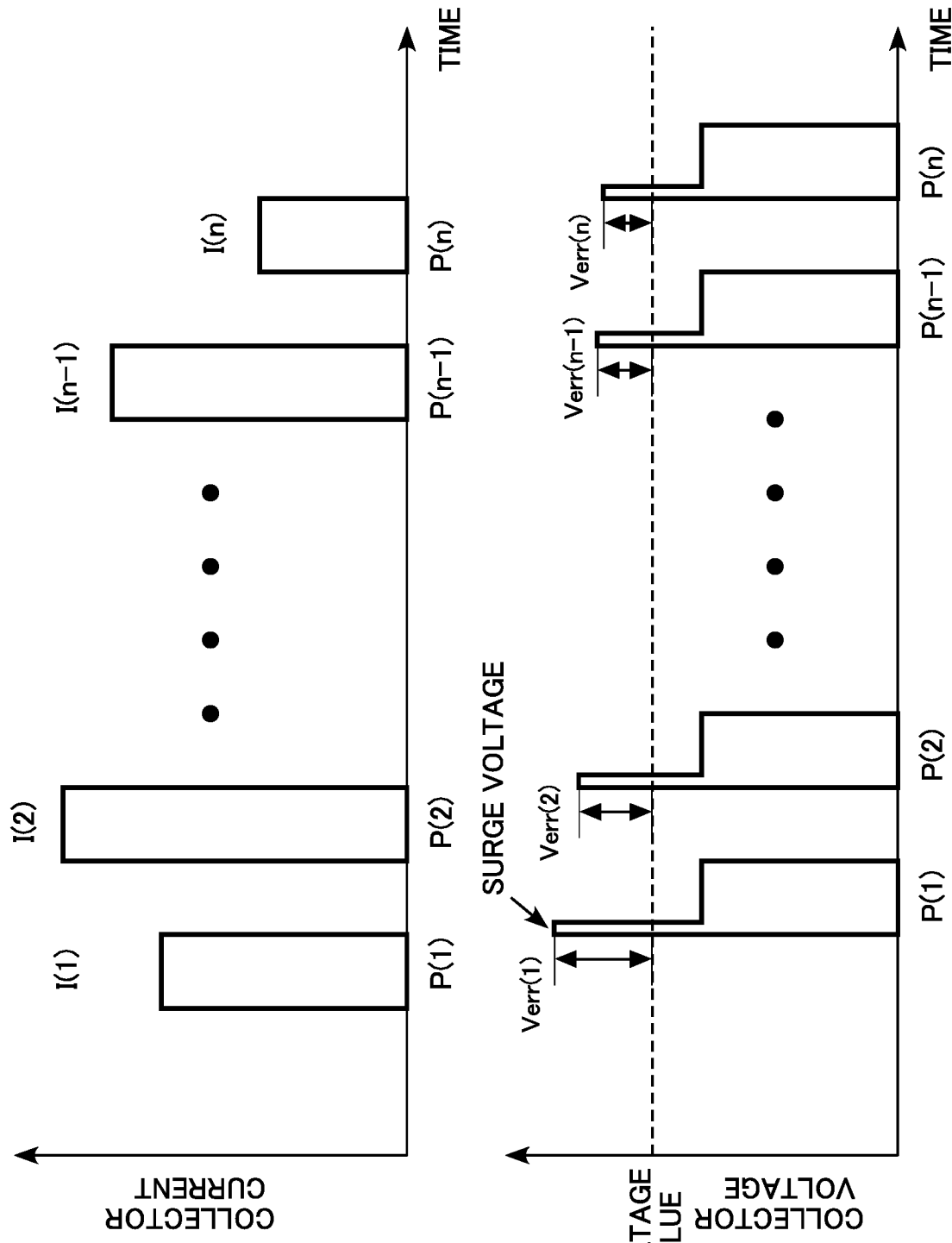
FIGS. 7A and 7B are explanatory diagrams of functions of the semiconductor device and the method for controlling a semiconductor device according to the second embodiment.

FIGS. 7A and 7B are explanatory diagrams of functions of the semiconductor device and the method for controlling a semiconductor device according to the second embodiment. FIGS. 7A and 7B show a collector current and a collector voltage corresponding to each pulse of the gate signal applied to the low side transistor 10. FIG. 7A shows the collector current corresponding to each pulse of the gate signal, and FIG. 7B shows the collector voltage corresponding to each pulse of the gate signal.

In FIGS. 7A and 7B, the first pulse applied to the gate electrode 10c is represented by P(1), the second pulse is represented by P(2), a (n−1)-th pulse is represented by P(n−1), and an n-th pulse is represented by P(n). Here, n is an integer of 3 or more.

In response to each pulse, the low side transistor 10 repeats the ON operation and the OFF operation. As shown in FIG. 7A, the collector current flows during the ON operation and the collector current is cut off during the OFF operation.

In FIG. 7A, it is assumed that the collector current is changed for each pulse. In the case of the operation of the inverter circuit 210, the collector current is changed for each pulse as shown in FIG. 7A.

As shown in FIG. 7B, when the low side transistor 10 is shifted from the ON operation to the OFF operation, the collector voltage overshoots and the surge voltage is generated. For example, an error Verr(1) exists between the surge voltage generated by the first pulse P1 and the surge voltage target value.

If the collector current is changed for each pulse, the magnitude of the surge voltage is also changed in proportion to the collector current. In the second embodiment, the change in the surge voltage according to the change in collector current is predicted. The resistance value of the first variable resistor 60 is determined using the surge voltage prediction value according to the second pulse acquired by the prediction.

The surge voltage prediction value is, for example, the increment of the surge voltage according to the increase in the collector current. The setting value is calculated, for example, by adding the surge voltage prediction value to the error Verr(1). In contrast, when the surge voltage prediction value is not added, the error Verr(2) may exceed Verr(1). Further, the error Verr (2) may not be sufficiently smaller than the Verr(1).

By using the surge voltage prediction value, the surge voltage when the second pulse P(2) is applied is suppressed more accurately, and the error Verr(2) becomes sufficiently smaller than the Verr(1). The same control is repeated ever after the second pulse P(2).

According to the second embodiment, the gate resistance is set, in particular, by considering the increase/decrease in the surge voltage according to the change in the collector current. Therefore, the gate resistance with high accuracy can be controlled. Therefore, in comparison with the first embodiment, the surge voltage can be suppressed more accurately, the switching loss can be suppressed, and the low-loss semiconductor device can be realized.

Further, according to the semiconductor device of the second embodiment, the inductance of the circuit can be calculated. Therefore, even if an event occurs in which the inductance of the circuit is changed during the operation of the inverter circuit 210, it is possible to continue the control of the gate resistance with high accuracy. Therefore, a highly reliable semiconductor device can be realized.

The event that the inductance of the circuit is changed during the operation of the inverter circuit 210 is an event that a part of the device connected to the inverter circuit 210 is separated due to a fault during the operation of the inverter circuit 210.

As described above, according to the second embodiment, the increase in the switching loss can be suppressed, and the low-loss semiconductor device and power conversion device, and the method for controlling a semiconductor device can be realized. Further, the measurement result of the surge voltage can be fed back to the gate resistance with a simple configuration. In addition, the number of processes of the circuit design of the semiconductor device and the power conversion device can be decreased. In addition, the highly reliable semiconductor device can be realized.

Third Embodiment

A semiconductor device according to a third embodiment is different from that of the first embodiment in that the semiconductor device further includes: a voltage measuring unit configured to measure a voltage of a wiring electrically connected to a first electrode or a second electrode; and an electromagnetic noise prediction unit configured to calculate an electromagnetic noise prediction value based on a voltage measurement value acquired by the voltage measuring unit, wherein a determination unit determines a setting value based on the electromagnetic noise prediction value. Hereinafter, a part of the description duplicated with the first embodiment will not be described.

Figure 8:
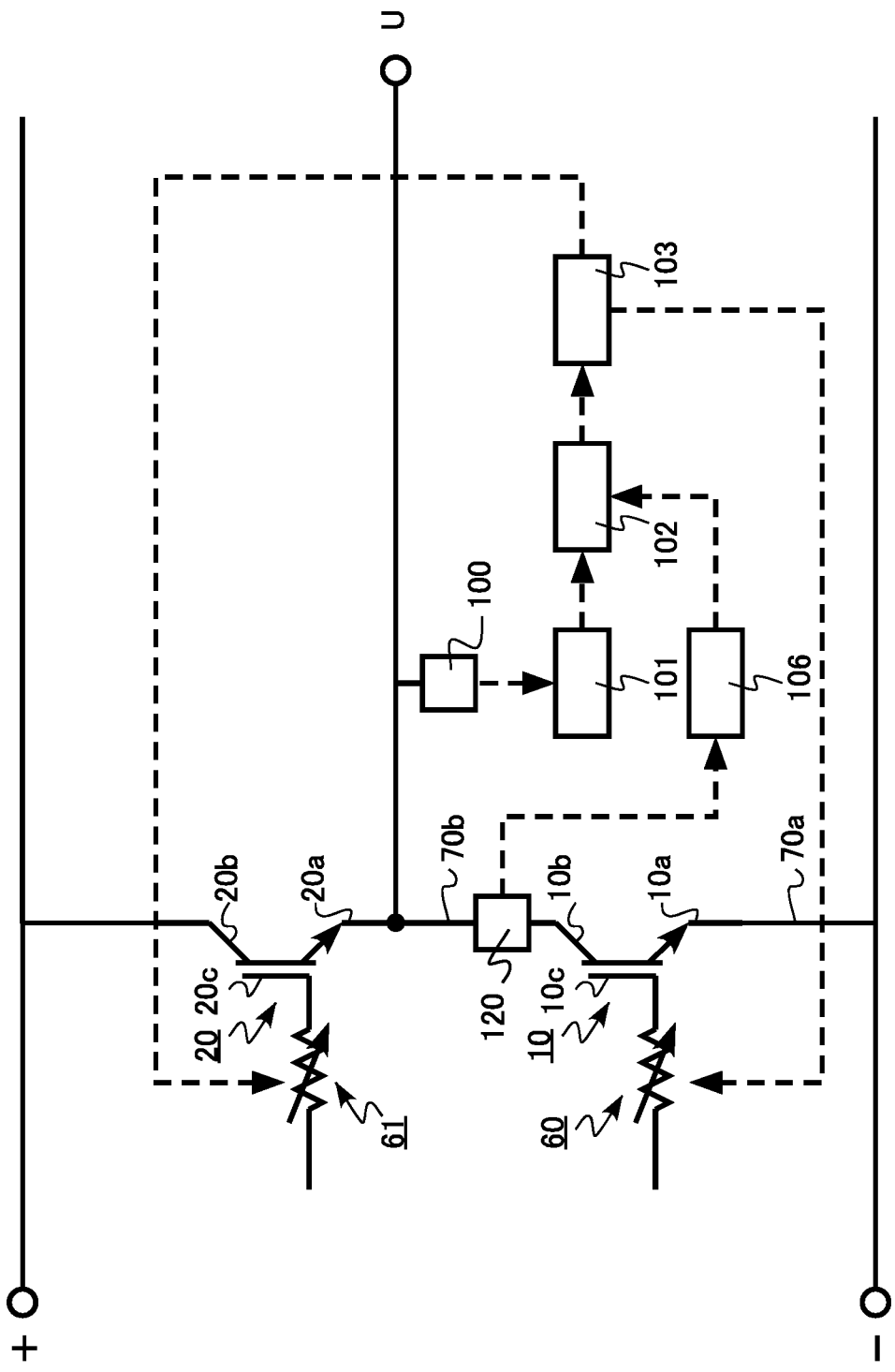
FIG. 8 is a schematic diagram of a semiconductor device according to a third embodiment.

FIG. 8 is a schematic diagram of a semiconductor device of the third embodiment. The power conversion device of the third embodiment is an inverter circuit using the semiconductor device of FIG. 8.

The semiconductor device of the third embodiment includes a low side transistor 10 (semiconductor element), a high side transistor 20, a surge voltage measuring unit 100, a comparator 101, a determination unit 102, an instruction unit 103, an electromagnetic noise prediction unit 106, a voltage measuring unit 120, a first variable resistor 60, a second variable resistor 61, a wiring 70a, and a wiring 70b.

The voltage measuring unit 120 has a function of measuring a voltage of the wiring 70b electrically connected to a collector electrode 10b. The voltage measuring unit 120 is, for example, a voltmeter. The configuration of the voltage measuring unit 120 is not limited as long as the voltage measuring unit 120 can measure a voltage generated in the wiring 70b.

The electromagnetic noise prediction unit 106 has a function of predicting the electromagnetic noise generated in the circuit based on the voltage measurement value acquired by the voltage measurement of the voltage measuring unit 120. The electromagnetic noise prediction unit 106 calculates the electromagnetic noise prediction value.

For example, the electromagnetic noise prediction unit 106 has a function of predicting the magnitude of the electromagnetic noise occurring in the wiring 70b from a change (dV/dt) in voltage generated in the wiring 70b. When the change in voltage is large, the occurring electromagnetic noise is also increased. In this example, the voltage change (dV/dt) is the voltage measurement value.

Like the first embodiment, the determination unit 102 has a function of determining setting values of the resistance values of the first variable resistor 60 and the second variable resistor 61 based on the comparison result by the comparator 101. For example, based on an error between a surge voltage measurement value and a surge voltage target value, a first setting value to be applied after a second pulse subsequent to a first pulse is obtained.

In addition, the determination unit 102 has a function of determining the setting values of the resistance values of the first variable resistor 60 and the second variable resistor 61 based on the electromagnetic noise prediction value. For example, based on an error between the electromagnetic noise prediction value and the electromagnetic noise target value, a second setting value to be applied after the second pulse subsequent to the first pulse is obtained.

For example, the determination unit 102 determines the larger one of the first setting value and the second setting value as the setting value to be applied after the second pulse subsequent to the first pulse.

Figure 9:
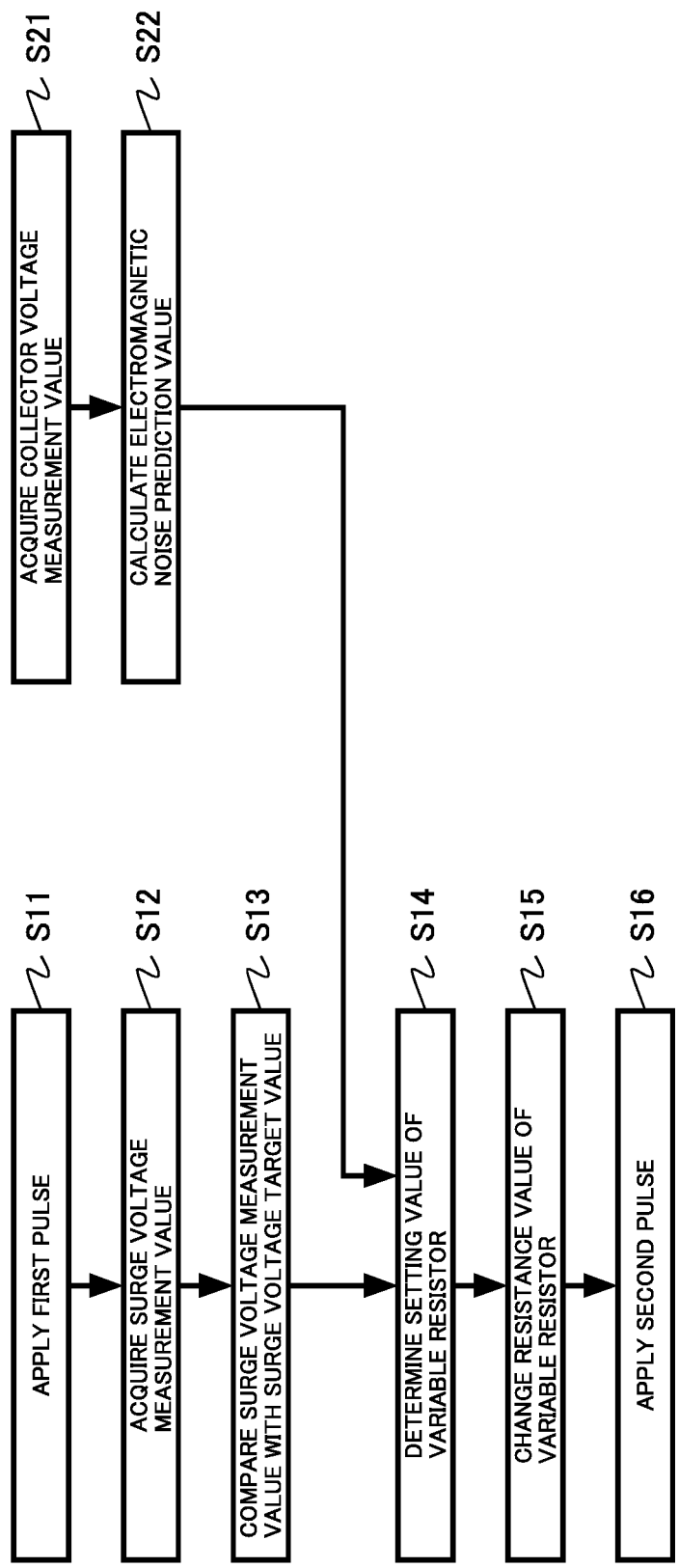
FIG. 9 is a diagram showing control steps of a method for controlling a semiconductor device according to the third embodiment.

FIG. 9 is a diagram showing control steps of the method for controlling a semiconductor device according to the third embodiment. The method for controlling a semiconductor device of the third embodiment includes: applying a first pulse (S11), acquiring a surge voltage measurement value (S12), comparing the surge voltage measurement value with a surge voltage target value (S13), determining of a setting value of a variable resistor (S14), changing a resistance value of the variable resistor (S15), applying a second pulse (S16), acquiring a collector voltage measurement value (S21), and predicting electromagnetic noise (S22).

For simplicity of explanation, the control of the first variable resistor 60 will be described below by way of example.

First, in the applying of the first pulse (S11), the first pulse is applied to the gate electrode 10c of the low side transistor 10.

Next, in the acquiring of the surge voltage measurement value (S12), the surge voltage generated in the collector electrode 10b by the application of the first pulse is measured by the surge voltage measuring unit 100.

Next, in the comparing of the surge voltage measurement value with the surge voltage target value (S13), the surge voltage measurement value is compared with the surge voltage target value. The comparison between the surge voltage measurement value and the surge voltage target value is performed by the comparator 101.

In the acquiring of the collector voltage measurement value (S21), the voltage of the wiring 70b electrically connected to the collector electrode 10b is measured. The measurement of the voltage is performed by the voltage measuring unit 120. The collector voltage measurement value is acquired by the measurement of the voltage.

Next, in the predicting of the electromagnetic noise (S22), the electromagnetic noise prediction value is calculated from the collector voltage measurement value. The calculation of the electromagnetic noise prediction value is performed by the electromagnetic noise prediction unit 106.

Next, in the determining of the setting value of the variable resistor (S14), the setting value of the resistance value of the first variable resistor 60 electrically connected to the gate electrode 10c is determined based on the comparison result of the surge voltage measurement value with the surge voltage target value and the electromagnetic noise predication value.

For example, the first setting value is obtained based on the comparison result between the surge voltage measurement value and the surge voltage target value. Further, for example, the second setting value is obtained based on the electromagnetic noise prediction value. For example, the larger one of the first setting value and the second setting value is determined as the setting value to be applied after the second pulse subsequent to the first pulse. The determination of the setting value is performed by the determination unit 102.

Next, in the changing of the resistance value of the variable resistor (S15), the resistance value of the first variable resistor 60 is changed to the determined setting value.

Next, in the applying of the second pulse (S16), the second pulse is applied to the gate electrode 10c of the low side transistor 10. The low side transistor 10 performs an ON operation, and is then shifted to an OFF operation.

The power transistor performing the switching operation at high speed causes the electromagnetic noise due to the high-speed circuit operation. If the electromagnetic noise occurs, for example, malfunction may occur in electronic devices around the power transistor. There is a problem in that the electromagnetic noise causes so-called electromagnetic interference (EMI).

According to the third embodiment, the measurement result of the surge voltage measuring unit 100 and the measurement result of the voltage measuring unit 120 are fed back to the resistance value of the first variable resistor 60. With this feedback, the suppression of the generation of the surge voltage and the suppression of the occurrence of the electromagnetic noise can be compatible.

As described above, according to the third embodiment, the increase in the switching loss can be suppressed, and the low-loss semiconductor device and power conversion device, and the method for controlling a semiconductor device can be realized. Further, the measurement result of the surge voltage can be fed back to the gate resistance with a simple configuration. In addition, the number of processes of the circuit design of the semiconductor device and the power conversion device can be decreased. In addition, the suppression of the generation of the surge voltage and the suppression of the occurrence of the electromagnetic noise can be compatible.

Fourth Embodiment

A semiconductor device and a power conversion device of a fourth embodiment are different from those of the first to third embodiments in that a detailed circuit configuration of the surge voltage measuring unit 100 is shown. Hereinafter, a part of the description duplicated with the first to third embodiments will not be described.

Figure 10:
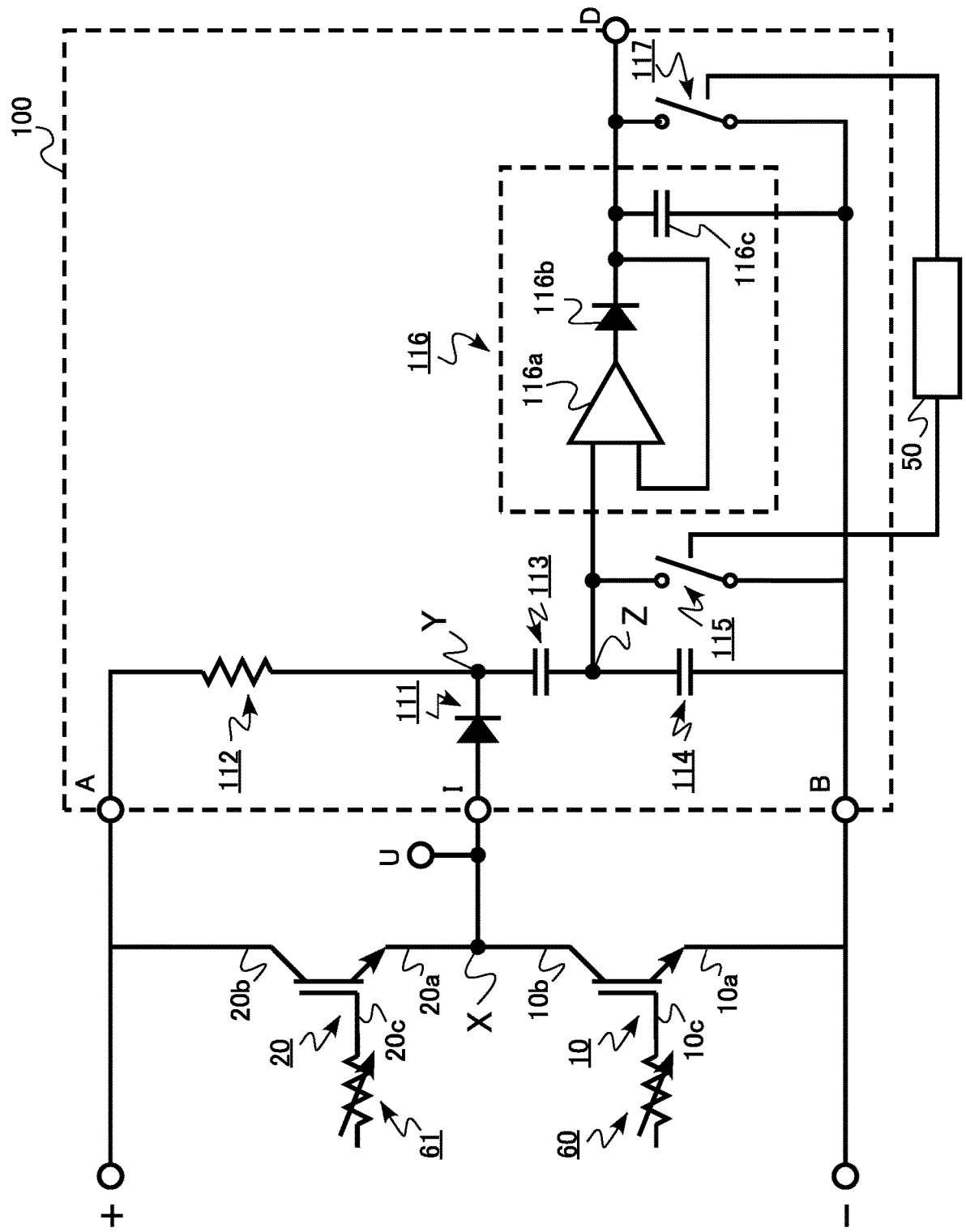
FIG. 10 is a circuit diagram of a surge voltage measuring unit according to a fourth embodiment.

FIG. 10 is a circuit diagram of a surge voltage measuring unit 100 according to the fourth embodiment.

The surge voltage measuring unit 100 includes a diode 111, an electric resistor 112, a capacitor 113, a capacitor 114, a switching element 115, a sample and hold circuit 116, a switching element 117, an input terminal A, an input terminal B, an input terminal I, and a detection terminal D.

The sample and hold circuit 116 includes an operational amplifier 116a, a diode 116b, and a capacitor 116c.

The input terminal A of the surge voltage measuring unit 100 is electrically connected to a positive electrode of a DC power supply. The input terminal B of the surge voltage measuring unit 100 is electrically connected to a negative electrode of the DC power supply.

The input terminal I of the surge voltage measuring unit 100 is electrically connected to a collector electrode 10b of a low side transistor 10 and an emitter electrode 20a of a high side transistor 20.

The detection result of the surge voltage is output from the detection terminal D of the surge voltage measuring unit 100.

An on-off operation of the switching element 115 and the switching element 117 is controlled, for example, by a switching controller 50.

According to the surge voltage measuring unit 100 of the fourth embodiment, a peak value of the surge voltage is maintained for a certain period of time by a rectification action of the diode 111, and the peak value of the surge voltage can be detected by being decreased by capacitance division of the capacitor 113 and the capacitor 114. Therefore, it is possible to realize a surge voltage detection circuit which directly detects the peak value of the surge voltage, which is a high voltage and a short time, generated in the power transistor.

As described above, according to the semiconductor device and the power conversion device of the fourth embodiment, the increase in the switching loss can be suppressed, and the low-loss semiconductor device and power conversion device can be realized. In addition, like the first embodiment, the number of processes of the circuit design of the semiconductor device and the power conversion device can be decreased.

Fifth Embodiment

A semiconductor device and a power conversion device of a fifth embodiment are different from those of the first to third embodiments in that a detailed circuit configuration of a surge voltage measuring unit 100 is shown. Hereinafter, a part of the description duplicated with the first to third embodiments will not be described.

Figure 11:
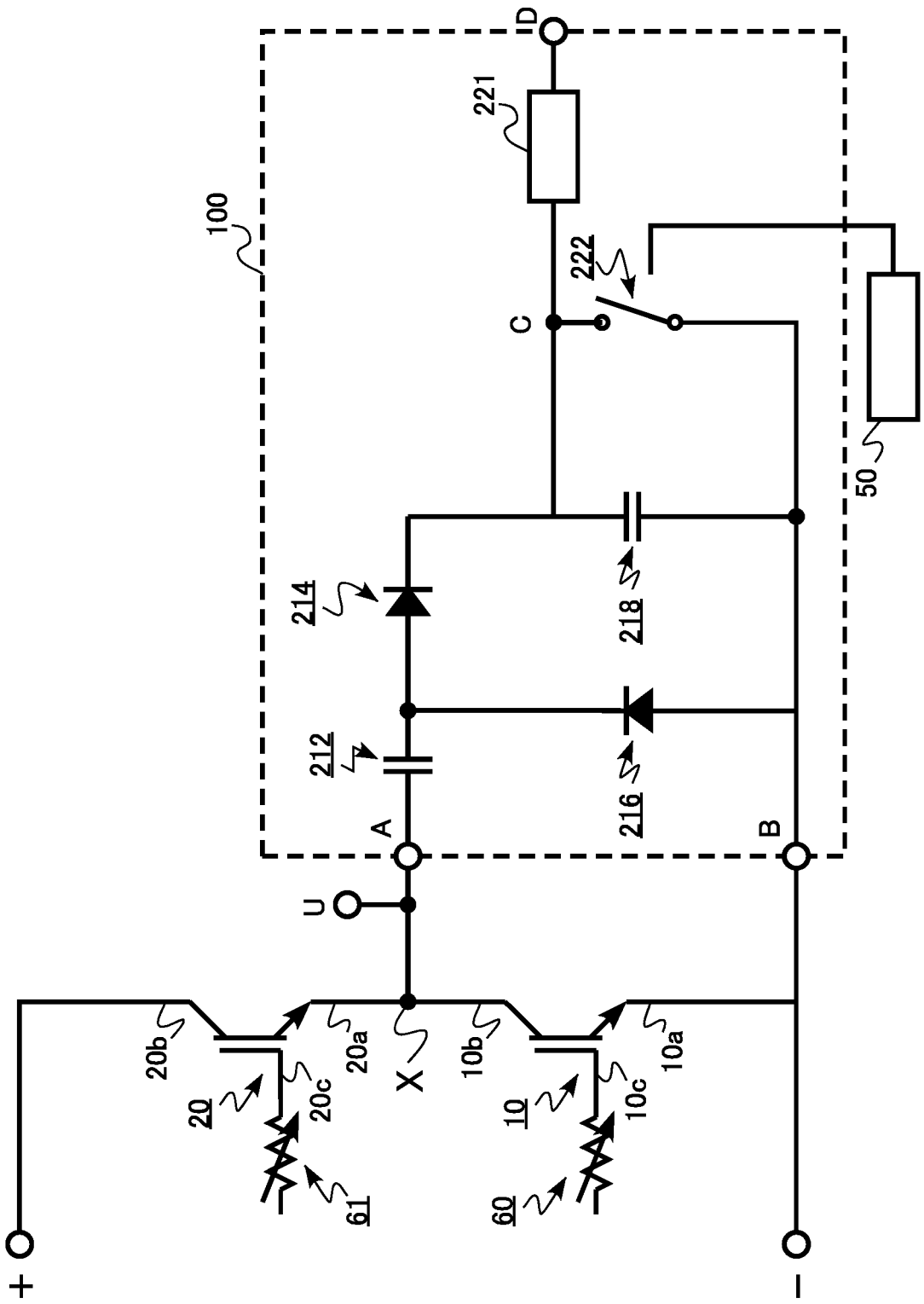
FIG. 11 is a circuit diagram of a surge voltage measuring unit according to a fifth embodiment.

FIG. 11 is a circuit diagram of the surge voltage measuring unit 100 according to the fifth embodiment.

The surge voltage measuring unit 100 includes a first capacitor 212, a first diode 214, a second diode 216, a second capacitor 218, a sample and hold circuit 221, a switch 222, an input terminal A, an input terminal B, and a detection terminal D.

The input terminal A of the surge voltage measuring unit 100 is electrically connected to a collector electrode 10b of a low side transistor 10 and an emitter electrode 20a of a high side transistor 20. The input terminal B of the surge voltage measuring unit 100 is electrically connected to a negative electrode of the DC power supply.

The detection result of the surge voltage is output from the detection terminal D of the surge voltage measuring unit 100.

An on-off operation of the switch 222 is controlled, for example, by a switching controller 50.

According to the surge voltage measuring unit 100 of the fifth embodiment, a displacement current flows by the first capacitor 212 and an electric charge is accumulated by the second capacitor 218. Then, a voltage increased by the accumulation of the electric charge is detected by the sample and hold circuit 221. A discharge of the electric charge accumulated in the second capacitor 218 is suppressed by the first diode 214. When the surge disappears, a current flows from the first capacitor 212 toward the input terminal A. The flow of the current is guaranteed by the second diode 216. Therefore, it is possible to realize a surge voltage detection circuit which directly detects the peak value of the surge voltage, which is a high voltage and a short time, generated in the power transistor.

As described above, according to the semiconductor device and the power conversion device of the fifth embodiment, the increase in the switching loss can be suppressed, and the low-loss semiconductor device and power conversion device can be realized. In addition, like the first embodiment, the number of processes of the circuit design of the semiconductor device and the power conversion device can be decreased.

Sixth Embodiment

A driving device of the sixth embodiment is the driving device including the power conversion device of the first embodiment.

Figure 12:
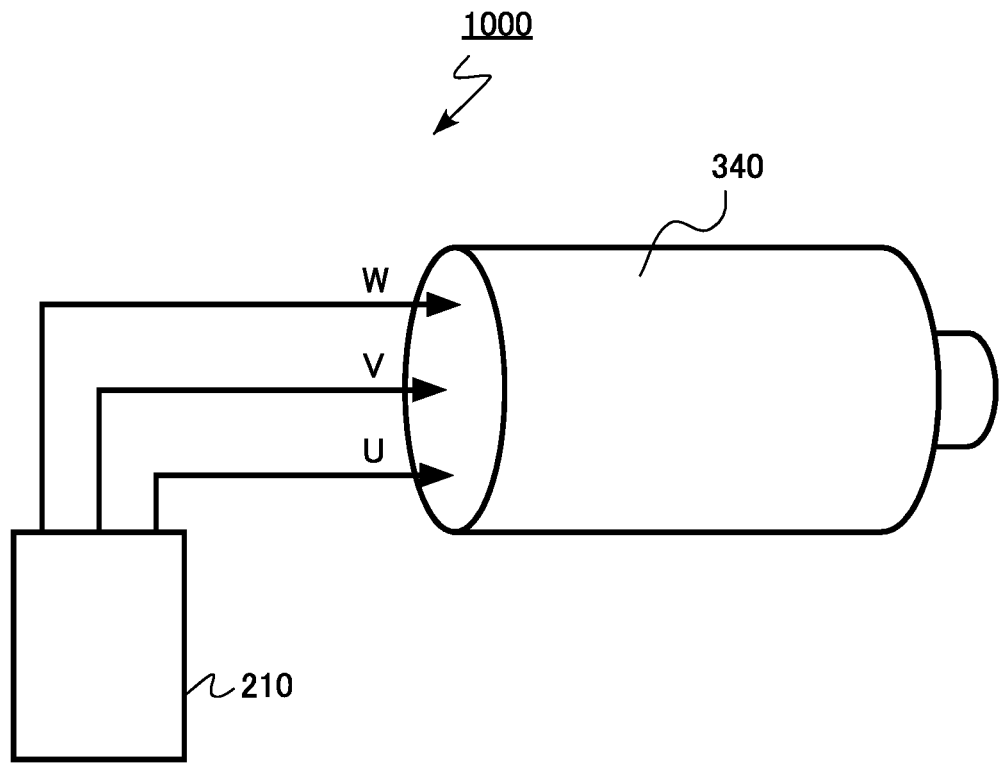
FIG. 12 is a schematic diagram of a driving device according to a sixth embodiment.

FIG. 12 is a schematic diagram of the driving device according to the sixth embodiment. A driving device 1000 includes a motor 340 and an inverter circuit 210. An AC voltage output from the inverter circuit 210 drives the motor 340.

According to the sixth embodiment, the characteristics of the driving device 1000 are improved by providing the low-loss inverter circuit 210.

Seventh Embodiment

A vehicle of the seventh embodiment is the vehicle including the power conversion device of the first embodiment.

Figure 13:
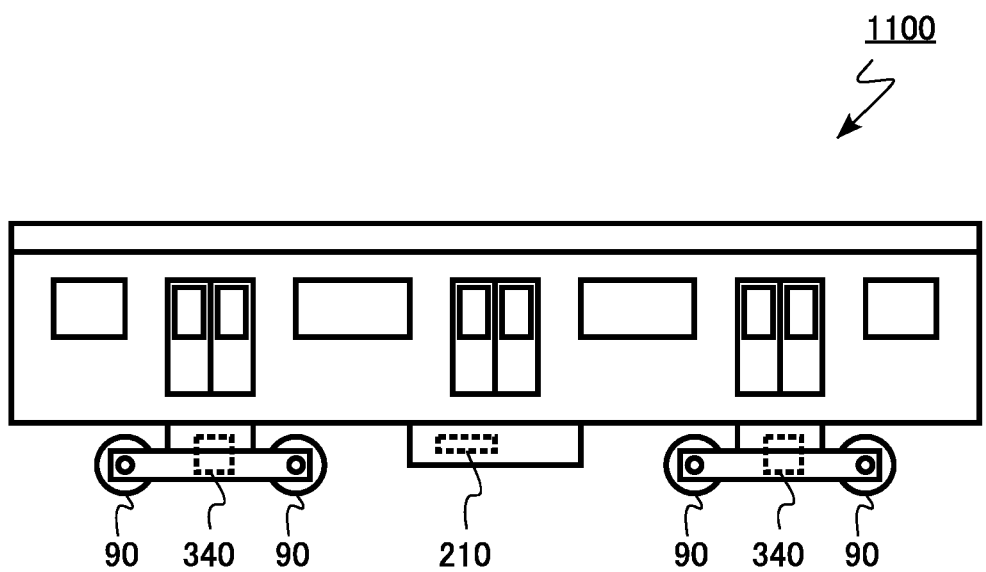
FIG. 13 is a schematic diagram of a vehicle according to a seventh embodiment.

FIG. 13 is a schematic diagram of the vehicle according to the seventh embodiment. A vehicle 1100 of the seventh embodiment is a railway vehicle. The vehicle 1100 includes a motor 340 and an inverter circuit 210.

An AC voltage output from the inverter circuit 210 drives the motor 340. Wheels 90 of the vehicle 1100 are rotated by the motor 340.

According to the seventh embodiment, the characteristics of the vehicle 1100 are improved by providing the low-loss inverter circuit 210.

Eighth Embodiment

A vehicle of the eighth embodiment is the vehicle including the power conversion device of the first embodiment.

Figure 14:
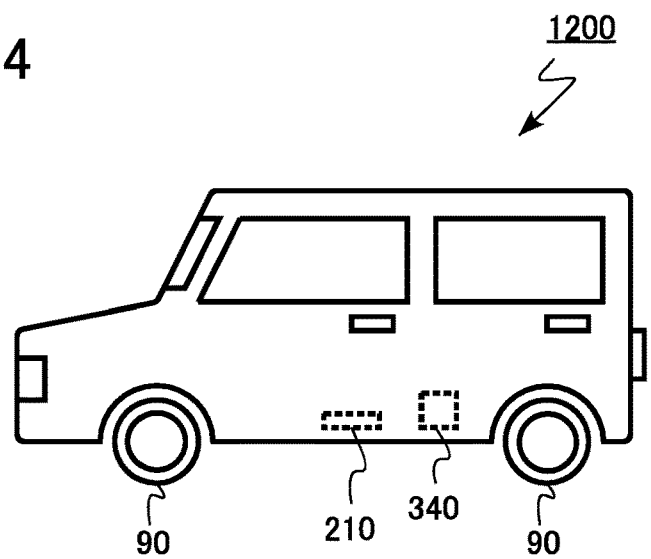
FIG. 14 is a schematic diagram of a vehicle according to an eighth embodiment.

FIG. 14 is a schematic diagram of the vehicle according to the eighth embodiment. A vehicle 1200 of the eighth embodiment is a car. The vehicle 1200 includes a motor 340 and an inverter circuit 210.

An AC voltage output from the inverter circuit 210 drives the motor 340. Wheels 90 of the vehicle 1200 are rotated by the motor 340.

According to the eighth embodiment, the characteristics of the vehicle 1200 are improved by providing the low-loss inverter circuit 210.

Ninth Embodiment

An elevator of a ninth embodiment is the elevator including the power conversion device of the first embodiment.

Figure 15:
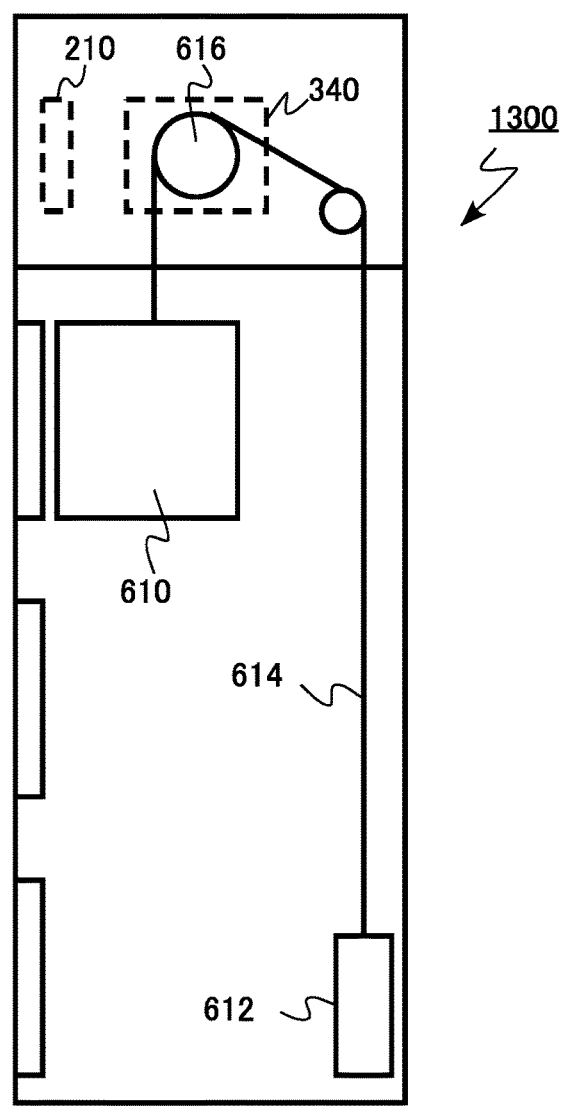
FIG. 15 is a schematic diagram of an elevator according to a ninth embodiment.

FIG. 15 is a schematic diagram of an elevator according to the ninth embodiment. An elevator 1300 of the ninth embodiment includes a car 610, a counterweight 612, a wire rope 614, a winding machine 616, a motor 340, and an inverter circuit 210.

An AC voltage output from the inverter circuit 210 drives the motor 340. The winding machine 616 is rotated by the motor 340, and the car 610 moves up and down.

According to the ninth embodiment, the characteristics of the elevator 1300 are improved by providing the low-loss inverter circuit 210.

In the first to fifth embodiments, the case in which the controller 300 controls both of the first variable resistor 60 and the second variable resistor 61, or both of the first gate signal generating circuit 400 and the second gate signal generating circuit 401 was described by way of example. However, the controller 300 can also be configured to control any one of the first variable resistor 60 or the second variable resistor 61, or any one of the first gate signal generating circuit 400 and the second gate signal generating circuit 401.

In the first to fifth embodiments, the inverter circuit is described as an example of the power conversion device, but a DC-DC converter may be applied as an example of the power conversion device. In addition, the case of controlling the semiconductor element of the power conversion device has been described byway of example, but the present disclosure can also be applied to the case of controlling the semiconductor element to be used other than the power conversion device.

In the first to fifth embodiments, an IGBT is described as an example of the semiconductor element, but the semiconductor element is not necessarily limited to the IGBT. For example, other semiconductor elements such as a metal oxide field effect transistor (MOSFET) can be applied.

The semiconductor elements of the first to fifth embodiments include a semiconductor layer of at least one selected from SiC, GaN, and Si, for example. The semiconductor elements of the first to fifth embodiments are formed using SiC, GaN, or Si, for example.

In the sixth to ninth embodiments, the case where the power conversion device of the first embodiment is applied is described by way of example, but it is also possible to apply the power conversion devices of the second to fifth embodiments.

In the sixth to ninth embodiments, the case where the semiconductor device and the power conversion device of the present disclosure are applied to the drive device, the vehicle, or the elevator has been described by way of example, but the semiconductor device and the power conversion device of the present disclosure can also be applied to a power conditioner of a photovoltaic power generation system, and the like.

While certain embodiments have been described, these embodiments have been presented by way of example only, and are not intended to limit the scope of the inventions. Indeed, a semiconductor device, a power conversion device, a driving device, a vehicle, an elevator, and a method for controlling a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An electronic circuit, comprising:
    a surge voltage measuring unit configured to electrically connect to a first electrode or a second electrode of a semiconductor element and measure a surge voltage occurring at the first electrode or the second electrode of the semiconductor element;
    a variable resistor configured to electrically connect to a gate electrode of the semiconductor element;
    a comparator comparing a surge voltage measurement value with a surge voltage target value, the surge voltage measurement value being acquired by the surge voltage measuring unit by measuring the surge voltage generated by a first pulse applied to the gate electrode;
    a determination unit determining a setting value of a resistance value of the variable resistor based on a comparison result by the comparator; and
    an instruction unit instructing the setting value to the variable resistor,
    wherein the instruction unit instructs the setting value to the variable resistor before a second pulse subsequent to the first pulse is applied to the gate electrode.

2. The electronic circuit according to claim 1, further comprising:
    a current measuring unit measuring a current of a wiring electrically connected to the first electrode or the second electrode;
    a calculator calculating an inductance using a surge voltage reference value acquired by the surge voltage measuring unit and a current reference value acquired by the current measuring unit; and
    a surge voltage prediction unit calculating a surge voltage prediction value from the inductance and a current prediction value of the semiconductor element,
    wherein the determination unit determines the setting value based on the surge voltage prediction value.

3. The electronic circuit according to claim 1, further comprising:
    a voltage measuring unit measuring a voltage of a wiring electrically connected to the first electrode or the second electrode; and
    an electromagnetic noise prediction unit calculating an electromagnetic noise prediction value based on a voltage measurement value acquired by the voltage measuring unit,
    wherein the determination unit determines the setting value based on the electromagnetic noise prediction value.

4. The electronic circuit according to claim 1, wherein the semiconductor element includes a semiconductor layer made of SiC, GaN, or Si.

5. The electronic circuit according to claim 1, wherein the semiconductor element is an insulated gate bipolar transistor (IGBT).

6. A power conversion device comprising the electronic circuit according to claim 1.

7. A driving device comprising the power conversion device according to claim 6.

8. A vehicle comprising the power conversion device according to claim 6.

9. An elevator comprising the power conversion device according to claim 6.

10. An electronic circuit according to claim 1, further comprising:
    the semiconductor element including the first electrode, the second electrode, and the gate electrode.

11. An electronic circuit, comprising:
    a surge voltage measuring unit configured to electrically connect to a first electrode or a second electrode of a semiconductor element and measuring a surge voltage occurring at the first electrode or the second electrode of the semiconductor element;

a variable resistor configured to electrically connect to a gate electrode of the semiconductor element;

a comparator comparing a surge voltage measurement value with a surge voltage target value, the surge voltage measurement value being acquired by the surge voltage measuring unit by measuring the surge voltage generated by a first pulse applied to the gate electrode;

a determination unit determining a setting value of a resistance value of the variable resistor based on a comparison result by the comparator;

an instruction unit instructing the setting value to the variable resistor, a current measuring unit measuring a current of a wiring electrically connected to the first electrode or the second electrode;

a calculator calculating an inductance using a surge voltage reference value acquired by the surge voltage measuring unit and a current reference value acquired by the current measuring unit; and a surge voltage prediction unit calculating a surge voltage prediction value from the inductance and a current prediction value of the semiconductor element, wherein the determination unit determines the setting value based on the surge voltage prediction value.

12. An electronic circuit according to claim 11, further comprising:

the semiconductor element including the first electrode, the second electrode, and the gate electrode.

13. An electronic circuit, comprising:

a surge voltage measuring unit configured to electrically connect to a first electrode or a second electrode of a semiconductor element and measuring a surge voltage occurring at the first electrode or the second electrode of the semiconductor element;

a variable resistor configured to electrically connect to a gate electrode of the semiconductor element;

a comparator comparing a surge voltage measurement value with a surge voltage target value, the surge voltage measurement value being acquired by the surge voltage measuring unit by measuring the surge voltage generated by a first pulse applied to the gate electrode;

a determination unit determining a setting value of a resistance value of the variable resistor based on a comparison result by the comparator; and an instruction unit instructing the setting value to the variable resistor, a voltage measuring unit measuring a voltage of a wiring electrically connected to the first electrode or the second electrode; and an electromagnetic noise prediction unit calculating an electromagnetic noise prediction value based on a voltage measurement value acquired by the voltage measuring unit, wherein the determination unit determines the setting value based on the electromagnetic noise prediction value.

14. An electronic circuit according to claim 13, further comprising:

the semiconductor element including the first electrode, the second electrode, and the gate electrode.

* * * * *